United States Patent
Wang

(10) Patent No.: US 10,817,098 B2
(45) Date of Patent: Oct. 27, 2020

(54) DISPLAY MODULE AND METHOD FOR MANUFACTURING THE SAME, DISPLAY DEVICE AND WEARABLE DEVICE

(71) Applicant: BOE TECHNOLOGY GROUP CO., LTD., Beijing (CN)

(72) Inventor: Minghsi Wang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/038,611

(22) Filed: Jul. 18, 2018

(65) Prior Publication Data

US 2019/0171324 A1  Jun. 6, 2019

(30) Foreign Application Priority Data

Dec. 6, 2017 (CN) .......................... 2017 1 1275678

(51) Int. Cl.

| | |
|---|---|
| *G06F 3/041* | (2006.01) |
| *H01L 33/36* | (2010.01) |
| *H01L 33/56* | (2010.01) |
| *G02F 1/1335* | (2006.01) |
| *G06F 1/16* | (2006.01) |

(Continued)

(52) U.S. Cl.
CPC ...... *G06F 3/0414* (2013.01); *G02F 1/133528* (2013.01); *G06F 1/163* (2013.01); *G06F 3/041* (2013.01); *H01L 33/36* (2013.01); *H01L 33/56* (2013.01); *G02F 1/13338* (2013.01); *G06F 3/044* (2013.01); *G06F 3/045* (2013.01);

(Continued)

(58) Field of Classification Search
CPC ................... G06F 3/0414; G06F 3/041; G06F 2203/04103; G06F 3/044; G06F 3/045; G02F 1/133528; G02F 1/13338; H01L 33/36; H01L 33/56

See application file for complete search history.

(56) References Cited

U.S. PATENT DOCUMENTS

| | | | | |
|---|---|---|---|---|
| 6,122,973 A | * | 9/2000 | Nomura | ................ G01L 9/0075 361/283.4 |
| 10,254,894 B2 | * | 4/2019 | Nathan | ................ G06F 3/0414 |

(Continued)

FOREIGN PATENT DOCUMENTS

| | | |
|---|---|---|
| CN | 106201112 A | 12/2016 |
| CN | 106484188 A | 3/2017 |

(Continued)

OTHER PUBLICATIONS

First Office Action for CN Patent Application No. 201711275678.0 dated Jun. 19, 2020.

*Primary Examiner* — Benyam Ketema
(74) *Attorney, Agent, or Firm* — Dinsmore & Shohl LLP

(57) ABSTRACT

The present disclosure provides a display module and a method for manufacturing the same, a display device and a wearable device. The display module includes a display screen, at least one pressure sensing electrode, and a touch screen. The display screen includes a first and a second electrode on opposite sides of a display layer, and an encapsulation layer on the second electrode. The at least one pressure sensing electrode is disposed on the encapsulation layer and opposite to the second electrode. The touch screen is disposed on the at least one pressure sensing electrode and is insulated from the at least one pressure sensing electrode.

12 Claims, 3 Drawing Sheets

(51) Int. Cl.
  *G02F 1/1333* (2006.01)
  *G06F 3/044* (2006.01)
  *G06F 3/045* (2006.01)
(52) U.S. Cl.
  CPC .. *G06F 3/0412* (2013.01); *G06F 2203/04103* (2013.01); *G06F 2203/04105* (2013.01)

(56) References Cited

U.S. PATENT DOCUMENTS

| | | | |
|---|---|---|---|
| 2010/0265206 A1* | 10/2010 | Chen | G06F 3/044 345/174 |
| 2011/0037713 A1* | 2/2011 | Chen | G06F 3/045 345/173 |
| 2012/0274603 A1* | 11/2012 | Kim | G06F 3/044 345/174 |
| 2014/0218328 A1* | 8/2014 | Haapakoski | G02F 1/13338 345/174 |
| 2016/0098131 A1* | 4/2016 | Ogata | G06F 3/0414 345/173 |
| 2016/0334919 A1* | 11/2016 | Zhu | G06F 3/044 |
| 2017/0168641 A1* | 6/2017 | Cheng | G06F 3/0412 |
| 2018/0039372 A1* | 2/2018 | Cho | G06F 3/0416 |

FOREIGN PATENT DOCUMENTS

| | | |
|---|---|---|
| CN | 206039461 U | 3/2017 |
| CN | 206258839 U | 6/2017 |

\* cited by examiner

DISPLAY MODULE AND METHOD FOR MANUFACTURING THE SAME, DISPLAY DEVICE AND WEARABLE DEVICE

CROSS-REFERENCE TO RELATED APPLICATIONS

The present application claims priority to China Patent Application No. 201711275678.0 filed on Dec. 6, 2017, the disclosure of which is incorporated by reference herein in its entirety.

TECHNICAL FIELD

The present disclosure relates to a display module and a method for manufacturing the same, a display device and a wearable device.

BACKGROUND

At present, wearable devices develop very rapidly. With the development of semiconductor technology, the sizes of wearable devices are getting smaller and smaller.

In order to facilitate folding and carrying, the thicknesses of wearable devices also need to be smaller and smaller.

SUMMARY

According to one aspect of embodiments of the present disclosure, a display module is provided. The display module comprises: a display screen, comprising a first and a second electrode disposed on opposite sides of a display layer, and an encapsulation layer disposed on the second electrode; at least one pressure sensing electrode disposed on the encapsulation layer and opposite to the second electrode; and a touch screen disposed on the at least one pressure sensing electrode and insulated from the at least one pressure sensing electrode.

In some embodiments, the touch screen comprises a touch sensor and a transparent cap layer on the touch sensor; the display module further comprises an insulating layer disposed between the at least one pressure sensing electrode and the touch sensor.

In some embodiments, the touch screen comprises a transparent cap layer and a touch sensor disposed on the transparent cap layer, a material of the transparent cap layer comprises an insulating material.

In some embodiments, the at least one pressure sensing electrode comprises a plurality of pressure sensing electrodes spaced apart from each other, wherein a gap between adjacent pressure sensing electrodes of the plurality of pressure sensing electrodes is filled with an insulating material.

In some embodiments, the touch screen further comprises: a polarizer disposed between the transparent cap layer and the touch sensor.

In some embodiments, the first electrode is an anode, the second electrode is a cathode, and the display layer comprises an electroluminescent material.

In some embodiments, the first electrode is a pixel electrode, the second electrode is a common electrode, and the display layer comprises a liquid crystal material.

In some embodiments, a material of the at least one pressure sensing electrode is selected from a group of indium tin oxide, nano silver wire, metal mesh, carbon nanotube, or graphene.

In some embodiments, the at least one pressure sensing electrode has a thickness ranging from 300 nm to 1.2 μm.

According to another aspect of embodiments of the present disclosure, a display device which comprises a display module provided by any embodiment of the present disclosure is provided.

According to still another aspect of embodiments of the present disclosure, a wearable device which comprises a display device provided by any embodiment of the present disclosure is provided.

According to yet still another aspect of embodiments of the present disclosure, a method for manufacturing a display module is provided. The method comprises: providing a display screen, the display screen comprising a first and a second electrode disposed on opposite sides of a display layer, and an encapsulation layer disposed on the second electrode; forming at least one pressure sensing electrode disposed opposite to the second electrode on the encapsulation layer; and forming, on the at least one pressure sensing electrode, a touch screen insulated from the at least one pressure sensing electrode.

In some embodiments, the method further comprising: forming an insulating layer on the at least one pressure sensing electrode; forming the touch screen comprises: forming a touch sensor on the insulating layer; and forming a transparent cap layer on the touch sensor.

In some embodiments, forming the touch screen comprises: forming a transparent cap layer on the at least one pressure sensing electrode, wherein a material of the transparent cap layer comprises an insulating material; and forming a touch sensor on the transparent cap layer.

In some embodiments, the at least one pressure sensing electrode comprises a plurality of pressure sensing electrodes spaced apart from each other, wherein a gap between adjacent pressure sensing electrodes of the plurality of pressure sensing electrodes is filled with an insulating material.

In some embodiments, the method further comprising: forming a polarizer on the touch sensor, wherein the transparent cap layer is formed on the polarizer.

In some embodiments, the first electrode is an anode, the second electrode is a cathode, and the display layer comprises an electroluminescent material.

In some embodiments, the first electrode is a pixel electrode, the second electrode is a common electrode, and the display layer comprises a liquid crystal material.

In some embodiments, a material of the at least one pressure sensing electrode is selected from a group of indium tin oxide, nano silver wire, metal mesh, carbon nanotube, or graphene.

In some embodiments, the at least one pressure sensing electrode has a thickness ranging from 300 nm to 1.2 μm.

Other features, aspects and advantages of the present disclosure will become apparent from the following detailed description of exemplary embodiments of the present disclosure with reference to the accompanying drawings.

BRIEF DESCRIPTION OF THE DRAWINGS

The accompanying drawings, which constitute part of this specification, illustrate exemplary embodiments of the present disclosure and, together with this specification, serve to explain the principles of the present disclosure, in which.

Figure 1:
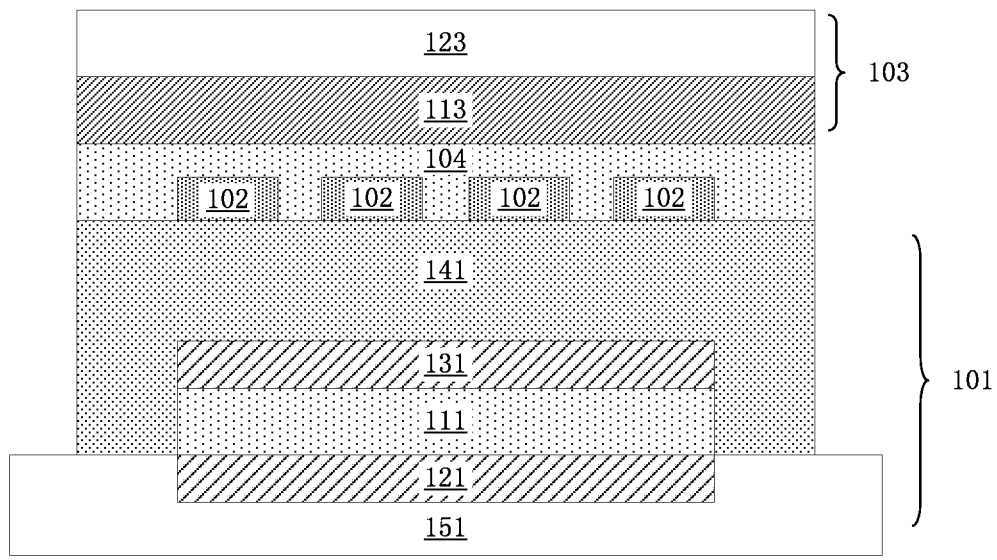
FIG. 1 is a schematic structural view showing a display module according to some embodiments of the present disclosure.

It should be understood that the dimensions of the various parts shown in the accompanying drawings are not drawn according to the actual scale. In addition, the same or similar reference signs are used to denote the same or similar components.

DETAILED DESCRIPTION

Various exemplary embodiments of the present disclosure will now be described in detail with reference to the accompanying drawings. The following description of the exemplary embodiments is merely illustrative and is in no way intended as a limitation to the present disclosure, its application or use. The present disclosure may be implemented in many different forms, which are not limited to the embodiments described herein. These embodiments are provided to make the present disclosure thorough and complete, and fully convey the scope of the present disclosure to those skilled in the art.

It should be noticed that: relative arrangement of components and steps, material composition, numerical expressions, and numerical values set forth in these embodiments, unless specifically stated otherwise, should be explained as merely illustrative, and not as a limitation.

The use of the terms "first", "second" and similar words in the present disclosure do not denote any order, quantity or importance, but are merely used to distinguish between different parts. A word such as "comprise", "have" or variants thereof means that the element before the word covers the element(s) listed after the word without excluding the possibility of also covering other elements. The terms "up", "down", or the like are used only to represent a relative positional relationship, and the relative positional relationship may be changed correspondingly if the absolute position of the described object changes.

In the present disclosure, when it is described that a specific component is disposed between a first component and a second component, there may be an intervening component between the specific component and the first component or between the specific component and the second component. When it is described that a specific part is connected to other parts, the specific part may be directly connected to the other parts without an intervening part, or not directly connected to the other parts with an intervening part.

Unless otherwise defined, all terms (including technical and scientific terms) used herein have the same meanings as the meanings commonly understood by one of ordinary skill in the art to which the present disclosure belongs. It should also be understood that terms as defined in general dictionaries, unless explicitly defined herein, should be interpreted as having meanings that are consistent with their meanings in the context of the relevant art, and not to be interpreted in an idealized or extremely formalized sense.

Techniques, methods, and apparatus known to those of ordinary skill in the relevant art may not be discussed in detail, but where appropriate, these techniques, methods, and apparatuses should be considered as part of this specification.

Current wearable device has relatively large thickness which makes the wearable device not easy to fold and carry. In order to achieve pressure sensing in the current wearable device, it is necessary to externally attach a pressure sensing element below the backplane of a display screen. The thickness of the externally attached pressure sensing element is generally relatively large, for example, in hundreds of microns (μm), which makes the wearable device have relatively large thickness.

In order to solve the above problem, embodiments of the present disclosure propose a technical solution that integrates a pressure sensing electrode with a display screen and a touch screen, which will be described below in detail in conjunction with different embodiments.

FIG. 1 is a schematic structural view showing a display module according to some embodiments of the present disclosure. As shown in FIG. 1, the display module 100 may comprise a display screen 101, at least one pressure sensing electrode 102, and a touch screen 103 disposed on the at least one pressure sensing electrode 102.

The display screen 101 may comprise a first electrode 121 and a second electrode 131 on opposite sides of a display layer 111, and an encapsulation layer 141 on the second electrode 131.

In some embodiments, the first electrode 121 may be disposed in a backplane 151. However, the present disclosure is not limited thereto. It should be understood that the backplane 151 may also be provided with a driving circuit and various circuit elements, such as an array of thin film transistors (TFTs), a capacitor, a resistor, or a wire (not shown in the Figure). It should also be understood that the encapsulation layer 141 may surround the display layer 111 and the second electrode 131, and may cover a portion of the backplane 151. In some implementations, the encapsulation layer 141 may comprise an organic insulating material, an inorganic insulating material, or a combination thereof. In some embodiments, the encapsulation layer 141 may comprise a thin film encapsulation layer such as a laminate formed by alternately stacking an organic material layer and an inorganic material layer.

The at least one pressure sensing electrode 102 is disposed on the encapsulation layer 141 and opposite to the second electrode 131. Here, the pressure sensing electrode 102, the encapsulation layer 141, and the second electrode 131 may constitute a pressure sensing capacitor. A change in the capacitance of the touch pressure capacitor can be used to identify the magnitude of a touch pressure. In some embodiments, the pressure sensing electrode 102 may comprise a transparent conductive material, such as indium tin oxide (ITO), nano silver wire, metal mesh, carbon nanotube, or graphene.

The touch screen 103 is insulated from the at least one pressure sensing electrode 102.

In some implementations, referring to FIG. 1, the touch screen 103 may comprise a touch sensor 113 and a transparent cap layer 123 on the touch sensor 113. In this case, the display module may further comprise an insulation layer 104 disposed between the at least one pressure sensing electrode 102 and the touch sensor 113, so that the touch screen 103 is insulated from the pressure sensing electrode 102. The transparent cap layer 123 may comprise, for example, glass, polymethyl methacrylate (PMMA), polycarbonate (PC), or polyethylene terephthalate (PET). The insulating layer 104 may comprise an oxide of silicon, a nitride of silicon, an oxynitride of silicon, an organic insulating material, or the like. In some embodiments, the at least one pressure sensing electrode comprises a plurality of pressure sensing electrodes 102 spaced apart from each other, wherein a gap between adjacent pressure sensing electrodes 102 of the plurality of pressure sensing electrodes is filled with an insulating material. For example, the above insulating layer 104 may also fill a gap between adjacent pressure sensing electrodes 102.

It should be understood that the present disclosure is not limited to the above implementations. For example, in other implementations, the touch sensor 113 in the touch screen 103 may be disposed on the transparent cap layer 123 (not shown in the figure). That is, the transparent cap layer 123 is disposed between the touch sensor 113 and the pressure sensing electrode 102. In this case, since the transparent cap layer 123 is formed by an insulating material, the touch screen 103 and the pressure sensing electrode 102 can be insulated from each other, thereby no additional insulating layer is required to be provided.

It should be noted that the touch screen 103 may be a capacitive touch screen or a resistive touch screen. In the case where the touch screen 103 is a capacitive touch screen, the touch sensor 113 in the touch screen 103 may be a capacitive sensor for detecting a change in capacitance; in the case where the touch screen 103 is a resistive touch screen, the touch sensor 113 in the touch screen 103 may be a resistive sensor for detecting a change in resistance.

In the above embodiment, the pressure sensing electrode, the encapsulation layer and the second electrode may form a capacitor for detecting a touch pressure change. Since the pressure sensing electrode is integrated between the display screen and the touch screen and is not externally attached to the backplane of the display screen, the pressure sensing electrode may have a smaller thickness. In this way, the thickness of the display module can be reduced while achieving touch pressure detection.

In one or more embodiments, the pressure sensing electrode 102 may have a thickness ranging from 300 nm-1.2 μm, such as 500 nm, 800 nm, or 1 μm.

In practical applications, the display screen 101 can be implemented in different ways, which will be described in detail below by way of example.

In some embodiments, the display layer 111 may comprise an electroluminescent material such as an organic electroluminescent material. Correspondingly, the first electrode 121 may be an anode and the second electrode 131 may be a cathode. In some implementations, the anode may comprise a transparent conductive material such as tin oxide, indium oxide, zinc oxide, ITO, or indium zinc oxide (ZTO). In some implementations, the cathode may comprise a metal material, such as magnesium, aluminum, or silver.

In other embodiments, the display layer 111 may comprise a liquid crystal material. Accordingly, the first electrode 121 may be a pixel electrode, and the second electrode 131 may be a common electrode. The pixel electrode and the common electrode may comprise a transparent conductive material, such as tin oxide, indium oxide, zinc oxide, ITO, or ZTO.

Figure 2:
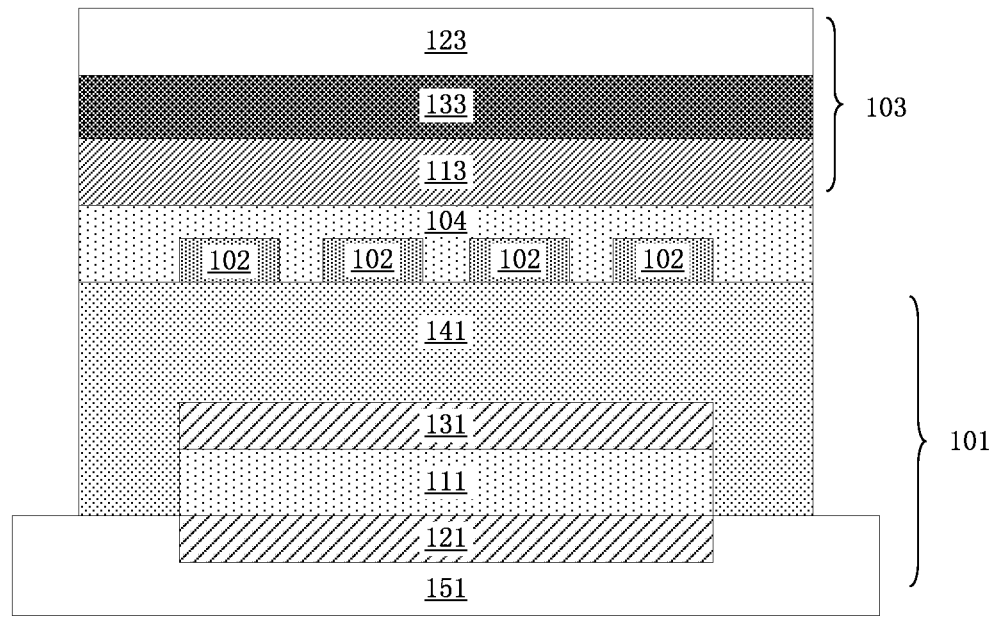
FIG. 2 is a schematic structural view showing a display module according to other embodiments of the present disclosure.

FIG. 2 is a schematic structural view showing a display module according to other embodiments of the present disclosure. The following description only focuses on the differences between the display module shown in FIG. 2 and the display module shown in FIG. 1. Other same parts can be seen in the above description.

As shown in FIG. 2, compared with the display module 100 shown in FIG. 1, the touch panel 103 in the display module 200 may further comprise a polarizer 133 disposed between the transparent cap layer 123 and the touch sensor 113.

In the above embodiment, a polarizer is provided under the transparent cap layer. The polarizer can reduce the influence of the reflection of ambient light on the display effect of the display screen and improve the display performance.

The display modules provided by various embodiments of the present disclosure may be used in but not limited to a flexible device such as a flexible display device. In some embodiments, the display screen in the display module may be a flexible display screen, and the touch screen may be a flexible touch screen.

Figure 3:
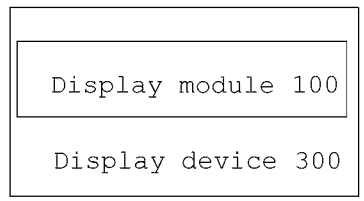
FIG. 3 is a schematic structural view showing a display device according to some embodiments of the present disclosure.

FIG. 3 is a schematic structural view showing a display device according to some embodiments of the present disclosure.

The display device 300 may comprise the display module of any one of the above embodiments, such as the display module 100 or the display module 200. Here, FIG. 3 only schematically shows a case where the display device 300 comprises the display module 100. Of course, the display device may also comprise other components, for example, a backlight assembly.

In the above embodiment, since the display module may have a smaller thickness, the thickness of the display device may be reduced.

Figure 4:
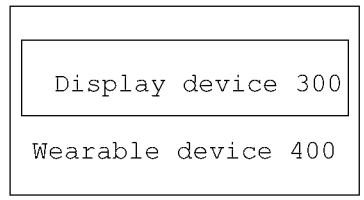
FIG. 4 is a schematic structural view showing a wearable device according to some embodiments of the present disclosure.

FIG. 4 is a schematic structural view showing a wearable device according to some embodiments of the present disclosure.

As shown in FIG. 4, the wearable device 400 may comprise the display device 300 of any one of the above embodiments.

In the above embodiment, since the display device may have a smaller thickness, the thickness of the wearable device may be reduced.

The present disclosure also provides a method for manufacturing a display module, which will be described below with reference to the embodiments shown in FIGS. 5 and 6.

Figure 5:
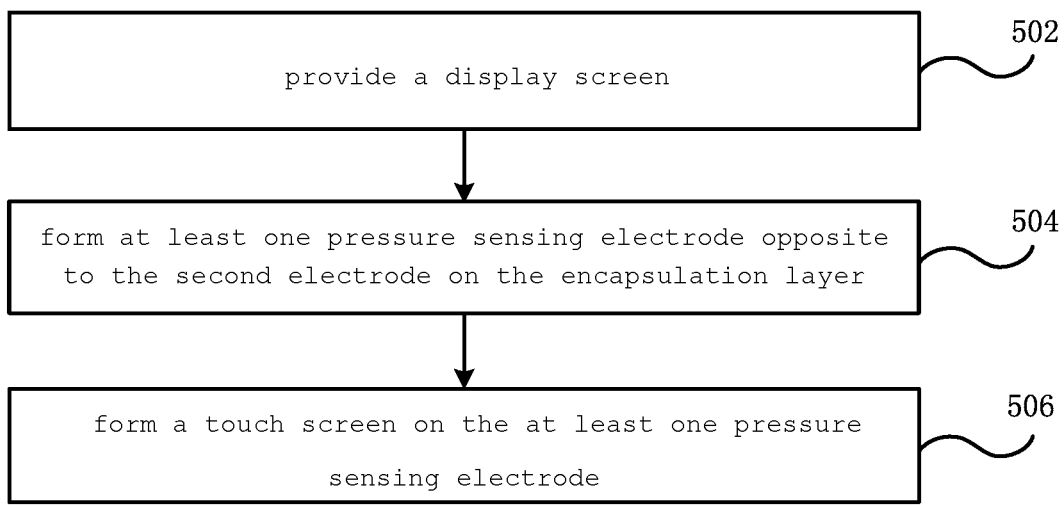
FIG. 5 is a schematic flow chart illustrating a method for manufacturing a display module according to some embodiments of the present disclosure.

FIG. 5 is a schematic flow chart illustrating a method for manufacturing a display module according to some embodiments of the present disclosure.

At step 502, a display screen is provided. The display screen may comprise a first and a second electrode disposed on opposite sides of a display layer, and an encapsulation layer disposed on the second electrode.

In some embodiments, the first electrode is an anode, the second electrode is a cathode, and the display layer comprises an electroluminescent material. In other embodiments, the first electrode is a pixel electrode, the second electrode is a common electrode, and the display layer may comprise a liquid crystal material.

At step 504, at least one pressure sensing electrode disposed opposite to the second electrode is formed on the encapsulation layer.

For example, a transparent conductive material such as nanosilver wire, or ITO may be formed on the encapsulation layer as a pressure sensing electrode by a screen printing process or a lithography process.

At step 506, a touch screen insulated from the at least one pressure sensing electrode is formed on the at least one pressure sensing electrode.

For example, the touch screen formed may comprise a touch sensor and a transparent cap layer on the touch sensor. In this case, an insulating layer may be formed first on the at least one pressure sensing electrode, and then a touch screen may be formed on the insulating layer. In some embodiments, the at least one pressure sensing electrode comprises a plurality of pressure sensing electrodes spaced apart from each other, wherein a gap between adjacent pressure sensing electrodes of the plurality of pressure sensing electrodes is filled with an insulating material. In some implementations, the insulating material filled in the gap between adjacent pressure sensing electrodes and the insulating layer on the at least one pressure sensing electrode can be formed by one step. In other implementations, the insulating material filled in the gap between adjacent pressure sensing electrodes and the insulating layer on the at least one pressure sensing electrode can be formed by two steps, for example, the insulating material filled in the gap between adjacent pressure sensing electrodes can be formed by one step, and the insulating layer on the at least one pressure sensing electrode can be formed by another step.

As another example, the touch screen formed may comprise a transparent cap layer and a touch sensor on the transparent cap layer, and the material of the transparent cap layer is an insulating material. In this case, a touch screen may be formed directly on the at least one pressure sensing electrode.

In the above embodiment, the pressure sensing electrode, the encapsulation layer and the second electrode may form a capacitor for detecting a touch pressure change. Since the pressure sensing electrode is integrated between the display screen and the touch screen and is not externally attached to the backplane of the display screen, the pressure sensing electrode may have a smaller thickness. In this way, the thickness of the display module can be reduced while achieving touch pressure detection.

Figure 6:
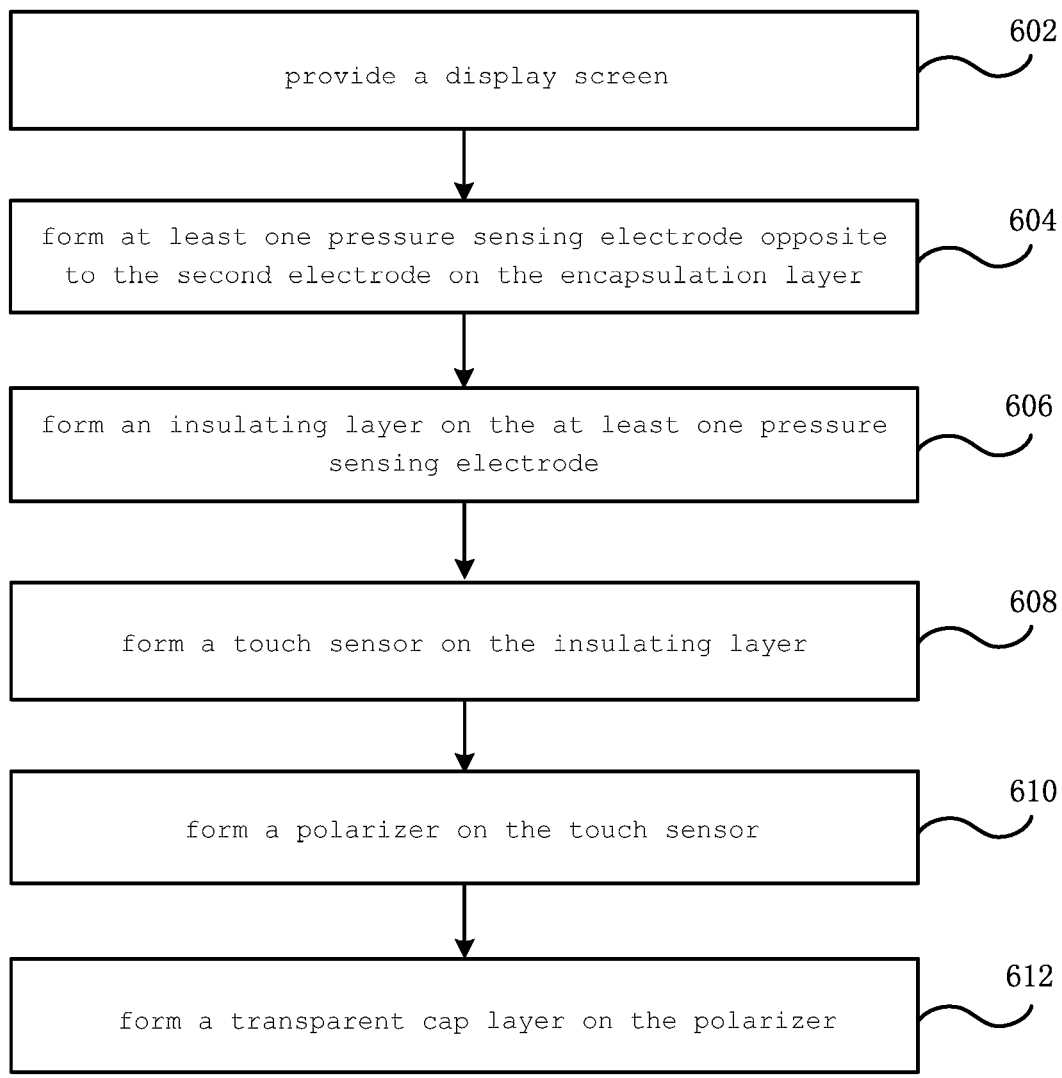
FIG. 6 is a schematic flow chart illustrating a method for manufacturing a display module according to other embodiments of the present disclosure.

FIG. 6 is a schematic flow chart illustrating a method for manufacturing a display module according to other embodiments of the present disclosure.

In the following description, the same/similar steps as/to FIG. 5, which can be seen in the corresponding description of FIG. 5, will not be repeated herein.

At step 602, a display screen is provided. The display screen may comprise a first and a second electrode disposed on opposite sides of a display layer, and an encapsulation layer disposed on the second electrode.

At step 604, at least one pressure sensing electrode disposed opposite to the second electrode is formed on the encapsulation layer.

At step 606, an insulating layer is formed on the at least one pressure sensing electrode.

For example, an insulating material such as an oxide of silicon, a nitride of silicon, or a nitride oxide of silicon may be formed as the insulating layer.

At step 608, a touch sensor is formed on the insulating layer. The touch sensor may be a capacitive touch sensor or a resistive touch sensor.

At step 610, a polarizer is formed on the touch sensor.

At step 612, a transparent cap layer is formed on the polarizer so as to form a touch screen comprising a touch sensor, a polarizer, and a transparent cap layer.

In the above embodiment, a polarizer is formed under the transparent cap layer of the touch screen. The polarizer can reduce the influence of the reflection of ambient light on the display effect of the display screen and improve the display performance.

Hereto, various embodiments of the present disclosure have been described in detail. Some details well known in the art are not described to avoid obscuring the concept of the present disclosure. According to the above description, those skilled in the art would fully know how to implement the technical solutions disclosed herein.

Although some specific embodiments of the present disclosure have been described in detail by way of examples, those skilled in the art should understand that the above examples are only for the purpose of illustration and are not intended to limit the scope of the present disclosure. It should be understood by those skilled in the art that modifications to the above embodiments and equivalently substitution of part of the technical features can be made without departing from the scope and spirit of the present disclosure. The scope of the disclosure is defined by the following claims.

What is claimed is:

1. A display module, comprising:
   a backplane, and
   a first electrode, a display layer, a second electrode, an encapsulation layer, at least one pressure sensing electrode, an insulating layer, a touch sensor, a polarizer and a transparent cap layer sequentially located on the backplane in a direction perpendicular to the backplane,
   wherein the at least one pressure sensing electrode comprises a plurality of pressure sensing electrodes spaced apart from each other, and a gap between adjacent pressure sensing electrodes of the plurality of pressure sensing electrodes is filled with the insulating layer, and
   wherein the first electrode, the display layer, the second electrode and the encapsulation layer constitute a display screen, the at least one pressure sensing electrode, the encapsulation layer and the second electrode constitute a pressure sensing capacitor a touch screen, and the touch sensor, the polarizer and the transparent cap layer constitute a touch screen.

2. The display module according to claim 1, wherein the first electrode is an anode, the second electrode is a cathode, and the display layer comprises an electroluminescent material.

3. The display module according to claim 1, wherein the first electrode is a pixel electrode, the second electrode is a common electrode, and the display layer comprises a liquid crystal material.

4. The display module according to claim 1, wherein a material of the at least one pressure sensing electrode is selected from a group of indium tin oxide, nano silver wire, metal mesh, carbon nanotube, or graphene.

5. The display module according to claim 1, wherein the at least one pressure sensing electrode has a thickness ranging from 300 nm to 1.2 μm.

6. A display device, comprising: the display module according to claim 1.

7. A wearable device, comprising: the display device according to claim 6.

8. A method for manufacturing a display module, comprising:
   providing a backplane; and
   forming a first electrode, a display layer, a second electrode, an encapsulation layer, at least one pressure sensing electrode, an insulating layer, a touch sensor, a polarizer and a transparent cap layer sequentially located on the backplane in a direction perpendicular to the backplane, wherein the at least one pressure sensing electrode comprises a plurality of pressure sensing electrodes spaced apart from each other, and a gap between adjacent pressure sensing electrodes of the plurality of pressure sensing electrodes is filled with the insulating layer, and wherein the first electrode, the display layer, the second electrode and the encapsulation layer constitute a display screen, the at least one pressure sensing electrode, the encapsulation layer and the second electrode constitute a pressure sensing capacitor a touch screen, and the touch sensor, the polarizer and the transparent cap layer constitute a touch screen.

9. The method according to claim 8, wherein the first electrode is an anode, the second electrode is a cathode, and the display layer comprises an electroluminescent material.

10. The method according to claim 8, wherein the first electrode is a pixel electrode, the second electrode is a common electrode, and the display layer comprises a liquid crystal material.

11. The method according to claim 8, wherein a material of the at least one pressure sensing electrode is selected from a group of indium tin oxide, nano silver wire, metal mesh, carbon nanotube, or graphene.

12. The method according to claim 8, wherein the at least one pressure sensing electrode has a thickness ranging from 300 nm to 1.2 μm.

* * * * *